United States Patent [19]

Fujimori et al.

[11] Patent Number: 4,996,185

[45] Date of Patent: Feb. 26, 1991

[54] CERAMIC SUPERCONDUCTING THIN FILM

[75] Inventors: Naoji Fujimori; Keizo Harada; Shuji Yazu; Tetsuji Jodai, all of Hyogo, Japan

[73] Assignee: Sumitomo Electric Industries, Ltd., Osaka, Japan

[21] Appl. No.: 200,206

[22] Filed: May 31, 1988

[30] Foreign Application Priority Data

May 31, 1987 [JP] Japan ............................... 62-136939
May 31, 1987 [JP] Japan ............................... 62-136940
Jun. 4, 1987 [JP] Japan ............................... 62-140611
Jun. 4, 1987 [JP] Japan ............................... 62-140613

[51] Int. Cl.$^5$ ........................... B05D 5/12; B05D 5/06
[52] U.S. Cl. ........................................ 505/1; 156/600; 156/610; 252/521; 427/62; 505/729
[58] Field of Search ..................... 505/1, 729; 156/610, 156/600; 427/62; 252/521

[56] References Cited

U.S. PATENT DOCUMENTS 3,932,315 1/1976 Sleight ............................... 252/521

FOREIGN PATENT DOCUMENTS 0292959 11/1988 European Pat. Off. ............ 428/930
56-109824 8/1981 Japan .
60-173885 9/1985 Japan .

OTHER PUBLICATIONS

Beech et al., Phys. Rev. 35B (Jun. 1, 1987) 8778.
Bednorz et al., "Possible High $T_c$ Superconductivity in the Ba-La-Cu-O System", Z. Phys. B—Condensed Matter 64, pp. 189-193 (1986).
Hammond et al., MRS-Conf., Apr. 1987 ed. Gubser et al.
Wu et al., Appl. Phys. Letts. 51 (Sep. 14, 1987) 861.
Yee et al., in AIP Conf. Proc. #165, Nov. 6, 1987, ed. Harper et al., p. 132.
Chaudhari in Proc. 18th Intl. Conf., Kyoto 1987, Jap. Jour. Appl. Phys., Aug. 1987, vol. 26, p. 2023.
Chaudhari et al., Science, 238 (Oct. 16, 1987) 342.
Moriwaki et al., in High T-Superconductors ed. Gubser et al., Apr. 23-24, 1987, MRS-Pittsburgh, p. 85.
Suzuki et al., Jap. Jour. Appl. Phys. 26 (Apr. 1987), L-524.
Chaudhari et al., Phys. Rev. Letts., 58 (Jun. 1987) 2684.
Enomoto et al., Jap. Jour. Appl. Phys. 26 (Jul. 1987), L-1248.

*Primary Examiner*—Upendra Roy
*Attorney, Agent, or Firm*—Foley & Lardner, Schwartz, Jeffery, Schwaab, Mack, Blumenthal & Evans

[57] ABSTRACT

In a superconducting thin film composed of compound oxide containing at least one of element selected from a group comprising Y, La, Gd, Ho, Er, Tm, Yb, Dy, Sm, Eu and Lu, Ba and Cu, improvement in that said thin film consists of a single crystal or polycrystal whose c-axis is orientated to a predetermined direction or mono-directionally.

13 Claims, 2 Drawing Sheets

CERAMIC SUPERCONDUCTING THIN FILM

BACKGROUND OF THE INVENTION

1. Field of the invention

The present invention relates to a superconducting thin film possessing a high critical temperature, and more particularly, it relates to a superconducting thin film improved in the critical current density.

2. Description of the related art

The superconductivity is a phenomenon which is explained as a phenomenon of phase change of electrons in which the electrical resistance become zero and the perfect diamagnetism is observed.

A variety of superconducting devices have been proposed and studied in the field of electronics. One of typical applications of the superconductor is a device using the Josephson effect in which quantum efficiency is observed macroscopically when electric current is passed through a weak junction arranged between two superconducting bodies. Tunnel junction type Josephson device which is another typical application of the Josephson effect is expected to be a solution for realizing a highi-speed and low-power consuming switching device owing to a very narrow energy gap of the superconducting material. It is also expected to utilize the Josephson device as a high sensitive sensors or detectors for sensing very weak magnetic field, microwave, radiant ray or the like since variation of electromagnetic wave or magnetic field is reflected in variation of Josephson effect and can be observed as a quantum phenomenon precisely. Development of the superconducting devices is also demanded in the field of high-speed computers in which the power consumption per unit area is reaching to the upper limit of the cooling capacity with increment of the integration density in order to reduce energy consumption. It is also expected to utilize the superconductor in wiring material for electric circuits to reduce loss of power.

However, the critical temperature of superconductors could not exceed 23.2K of $Nb_3Ge$ which was the the highest Tc for all studies for the past ten years.

Possibility of existence of a new type of superconducting materials having much higher Tc was revealed by Bednorz and Müller who discovered a new oxide type superconductor in 1986 [Z. Phys. B64(1986) 189]

It had been known that certain ceramics material of compound oxides exhibit the property of superconductivity. For example, U.S. Pat. No. 3,932,315 discloses Ba-Pb-Bi type compound oxide which shows superconductivity and Japanese patent laid-open No. 60-173,885 discloses that Ba-Bi type compound oxides also show superconductivity. These superconductors, however, possess a rather lower transition temperature of about 10K and hence usage of liquidized helium (boiling point of 4.2K) as cryogen is indispensable to realize superconductivity.

This new oxide type superconducting material discovered by Bednorz and Müller is $[La, Ba]_2CuO_4$ which is called as the $K_2NiF_4$-type oxide having a crystal structure which is similar to a known perovskite type oxide. The $K_2NiF_4$-type oxides show such a high Tc as 30K which is extremely higher than the known superconducting materials.

It was also reported in the news parer that C. W. Chu et al. discovered in the United States of America another type of superconducting material having the critical temperature of about 90K in February 1987. This superconductor called as YBCO is a compound oxide of Ba-Y system represented by $YBa_2Cu_3O_{7-\delta}$.

Recently, it was reported that still another type compound oxides possessing superconducting property were discovered. These now superconductors are Bi-Sr-Ca-Cu type and Tl-Ea-Ca-Cu type compound oxides and possess Tcs of higher than 100K and improved chemical stability so that they do not suffer from deterioration during usage.

Thus, from the discovery of the abovementioned new type of compound oxide superconductors, the realization of high-temperature superconductors have arisen suddenly.

The thin film of superconducting material has been produced by the physical vapour deposition technique such as a sputtering method in which a sintered oxide is sputtered with Ar gas to deposit the resulting evaporated particles on a substrate. Then, the deposited thin film is heat-treated in an oxygen containing atmosphere or is exposed to an oxygen plasma.

The physical vapour deposition technique has been used for producing a thin film of the conventional type superconductors such as $Nb_3Ge$ and $BaPb_{1-x}Bi_xO_3$. In case of a thin film of $Nb_3Ge$, particles of Nb and Ge are sputtered out of several targets each consisting of Nb and Ge respectively and are deposited onto a substrate to form a film composed of $Nb_3Ge$. Japanese patent laid-open No. 56-109,824 discloses a process for producing a thin film of A compound oxide represented by the formula: $BaPb_{1-x}Bi_xO_3$ by means of sputtering technique.

The superconducting property of the compound oxide type superconductors deposited on a substrate is very sensitive to the oxygen deficiency in its crystal structure, so that, if the oxygen deficiency is not within an optimum range, a high Tc can not be observed and the discrepancy between the onset temperature and the critical temperature can not be reduced. Still more, the thin film of the superconducting compound oxide is apt to deteriorate.

One of problems of the superconducting thin films of the new type compound oxide is that they do not possess high critical current density (Jc). Namely, the critical current density of thin films prepared heretofore showed only several hundred $A/cm^2$ which is too low to utilize actually the thin films in electronics devices.

The present inventors have proposed processes for producing a thin film of compound oxide having a high Tc in U.S. patent application Ser. No. 154,714 titled "Process for preparing a superconducting thin film" filed in Feb. 5, 1988 and Ser. No. 167,895 titled "Process for preparing a superconducting thin film" filed in Mar. 14, 1988 in which a thin film is prepared by sputtering technique. The present inventors have continued to improve the superconducting property of the thin film and completed the present invention.

Therefore, an object of the present invention is to provide an improved superconducting thin film composed of compound oxide which possesses a higher critical current density (Jc) in addition to a high critical temperature (Tc).

SUMMARY OF THE INVENTION

The present invention provides a superconducting thin film composed of compound oxide containing at least one of element selected from a group comprising Y, La, Gd, Ho, Er, Tm, Yb, Dy, Nd, Sm, Eu and Lu, Ba and Cu, characterized in that said thin film consists of a single crystal or polycrystal whose c-axis is orientated to a predetermined direction in other words monodirectionally.

The superconducting thin films according to the present invention are thin films of compound oxides represented by the general formula:

$$Ln_1Ba_2Cu_3O_{7-\delta}$$

in which, Ln stands for an element selected from a group comprising Y, La, Gd, Ho, Er, Tm, Yb and Lu, and $\delta$ is a number which satisfies $0 < \delta < 1$. Namely, the superconducting thin films according to the present invention may be composed by following compound oxides:

$Y_1Ba_2Cu_3O_{7-\delta}$
$Nd_1Ba_2Cu_3O_{7-\delta}$
$Eu_1Ba_2Cu_3O_{7-\delta}$
$Dy_1Ba_2Cu_3O_{7-\delta}$
$Yb_1Ba_2Cu_3O_{7-\delta}$
$Ho_1Ba_2Cu_3O_{7-\delta}$
$Sm_1Ba_2Cu_3O_{7-\delta}$
$Gd_1Ba_2Cu_3O_{7-\delta}$
$Er_1Ba_2Cu_3O_{7-\delta}$
$Tm_1Ba_2Cu_3O_{7-\delta}$ in which $\delta$ is a number which satisfies $0 < \delta < 1$.

The thin film of compound oxide possesses an oxygen deficient perovskite type crystal structure.

In order to define characteristics of the superconducting thin films according to the present invention, following terms are defined:

(00n): an index of a crystal face of said thin film, wherein "n" is an integer $I_{MAX}$: an intensity of the most intense peak in a powder X-ray diffraction chart measured in a powder sample of a compound oxide represented by a formula: $Y_1Ba_2Cu_3O_7$ used as a reference, $I_{00n}$: an intensity of the (00n) plane said powder X-ray diffraction chart, $J_{MAX}$: an intensity of a crystal face which has the same index as the crystal face having the most intense peak in said powder X-ray diffraction chart and is observed in a X-ray diffraction chart measured in said thin film, $J_{00n}$: an intensity of the (00n) plane in said X-ray diffraction chart measured in said thin film.

The superconducting thin films according to the present invention can be distinguished from those that are obtained by prior art by the following characteristic X-ray diffraction pattern:

(1) X-ray diffraction chart of said thin film possesses at least one crystal face of (00n) plane having an intensity $J_{00n}$ in a X-ray diffraction pattern which satisfies the following relation:

$$J_{00n}/J_{MAX} \geq 2(I_{00n}/I_{MAX})$$

In a preferred embodiment, a thin film according to the present invention possesses the (00n) planes which satisfy the abovementioned equation at (002) plane, (003) plane, (005) plane and (006) plane.

(2) The intensities of (002) plane, (003) plane, (005) plane and (006) plane observed in a X-ray diffraction chart measured in the thin film are more than double of intensities of (111) plane and (112) plane.

The superconducting thin film according to the present invention can be prepared by the conventional physical vapor deposition technique such as RF sputtering method. The thin film obtained by the magnetron RF sputtering method exhibits superior superconducting properties because the resulting thin film has a preferable oxygen deficiency in the crystal structure. In fact, in case of a thin film composed of compound oxide, the superconducting properties are much influenced by oxygen deficiency in the crystal structure, so that it is also preferable to carry out the deposition of the thin film in a proper oxygen containing atmosphere in order to adjust the oxygen content in the thin film to a proper value.

Generally, the thin film of compound oxide type superconductors represented by the abovementioned formula: $Ln_1Ba_2Cu_3O_{7-\delta}$ exhibit such high Tc as 90K. But, the critical current density Jc which pass through thin films prepared by the conventional processes is limited to a rather low value, so that the thin film can not be utilized in practical applications. The reason that the current of much higher intensity can not be passed through the conventional thin film may come from such fact that the thin film possesses anisotropy in its crystal structure. Namely, the current passing along the direction which is in parallel with a plane defined by a-axis and b-axis of the crystal show a very high critical current density, while the current passing along the other directions is relatively lower. In the conventional superconducting thin films produced by the conventional process, the anisotropy of the crystal have not been taken into consideration and hence the ordered orientation of c-axis in the crystal is not realized, so that its critical current density is remained in a relatively lower value.

The problem is solved by the present invention in which the c-axis of the crystal of compound oxide of which the thin film is composed is ordered or orientation to a predetermined direction. For example, when the c-axis is orientated to a direction which is perpendicular to the plane defined by by a-axis and b-axis of the crystal, a current which has much higher critical current density can be delivered along a direction which is in parallel with the plane.

The compound oxide of the superconducting thin film is preferably composed of a single crystal but may be composed of polycrystal.

The direction of c-axis is preferably orientated to the direction which is perpendicular to the plane defined by by a-axis and b-axis of the crystal as is mentioned above. But, the direction of orientation is not limited strictly to the perpendicular direction but may be inclined at a predetermined direction. In another preferred case, the c-axis can be orientated to a direction which is in parallel with a surface of the substrate, in other words, to a crystal face on which the thin film is deposited to increase the critical current density along the depth of the thin film. In either case, the direction of orientation of c-axis is determined by the nature of the surface of the substrate or the nature of the crystal face on which the fin film is deposited.

In practice, when it is desired to orient the c-axis of the crystal to a direction which is perpendicular to the plane defined by by a-axis and b-axis of the crystal, the substrate is composed of a single crystal having such lattice constant or lattice constants in a-axis and/or b-axis that are proximate to those of a crystal to be prepared.

According to a preferred embodiment of the present invention, a thin film composed of a single crystal or polycrystals whose c-axis is orientated to a direction which is perpendicular to the plane defined by by a-axis and b-axis of the crystal is deposited on a (100) plane of a substrate of single crystal which has such lattice constant or lattice constants in a-axis and/or b-axis that are proximate to those of a crystal represented by a formula: $Ln_1Ba_2Cu_3O_7$ to realize a high critical current density along the direction which is in parallel with a surface of the substrate.

When it is desired to orient the c-axis of the crystal to a direction which is in parallel with the plane defined by by a-axis and b-axis of the crystal, the thin film is deposited on (110) plane of a substrate of a single crystal having such lattice constant or lattice constants in a-axis and/or b-axis that are proximate to those of a crystal to be prepared.

The substrate having lattice constants in a-axis and b-axis that are proximate to those of a crystal to be prepared may be selected from a group comprising MgO, $SrTiO_3$, $Al_2O_3$, sapphire, $SiO_2$, quartz, yttrium stabilized zirconia (YSZ) and ZnO. Particularly, MO and $SrTiO_3$ whose thermal expansion coefficient is similar to that of the thin film are preferably selected among these substrates.

It is apparent from the description abovementioned that the thin films according to the present invention have higher Jc than conventional superconducting thin film and hence they can be utilized advantageously in a applications of thin film devices, such as Matisoo switching elements or Josephson device, Anacker memory device or Superconducting Quantum Interference Device (SQUID)

Now, the process for preparing a superconducting thin film according to the present invention will be described with reference to illustrative Examples, but the scope of the present invention should not be limited thereto.

EXAMPLE 1

Preparation of a thin film

Powders of $Y_2O_3$, BaO and CuO were mixed at a atom ratio of Y: Ba : Cu = 1:2.15:3.2 and then sintered in air at 900° C. for 3 hours. The sintered mass obtained was then pulverized to prepare a sintered powder.

The sintered and pulverized powder is used as a powder target in a high-frequency magnetron sputtering machine to deposit a thin film on a substrate consisting of a single crystal of MgO under the following conditions:
Total gas pressure: $2 \times 10^{-2}$ Torr.
(Ratio of $O_2/Ar$): 0.16.
Index of a plane deposited: (100) plane of MgO.
Temperature of the substrate: 720° C.

The resulting thin film of a thickness of 1,000 Å was further heat-treated at 700° C. for 24 hours and then cooled down to ambient temperature slowly at a cooling rate of less than 3° C./min.

From the results of analysis described hereafter, it was concluded that the resulting thin film was composed of polycrystals consisting mainly of $Y_1Ba_2Cu_3O_{7-\delta}(0<\delta<1)$.

The results of Analysis

Figure 1:
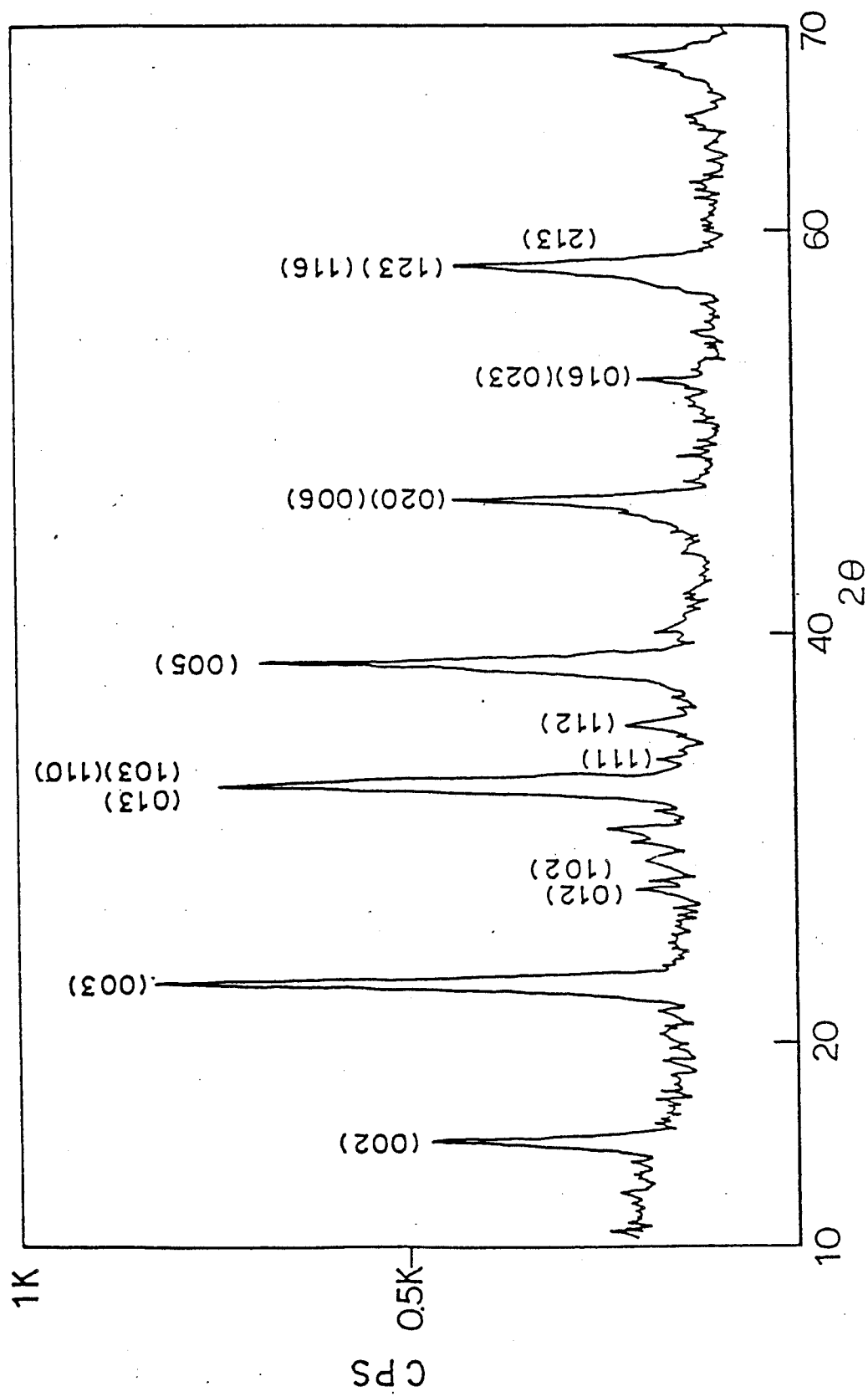
FIG. 1 is a X-ray diffraction chart observed in a thin film prepared in Example 1 of the present invention.
Figure 2:
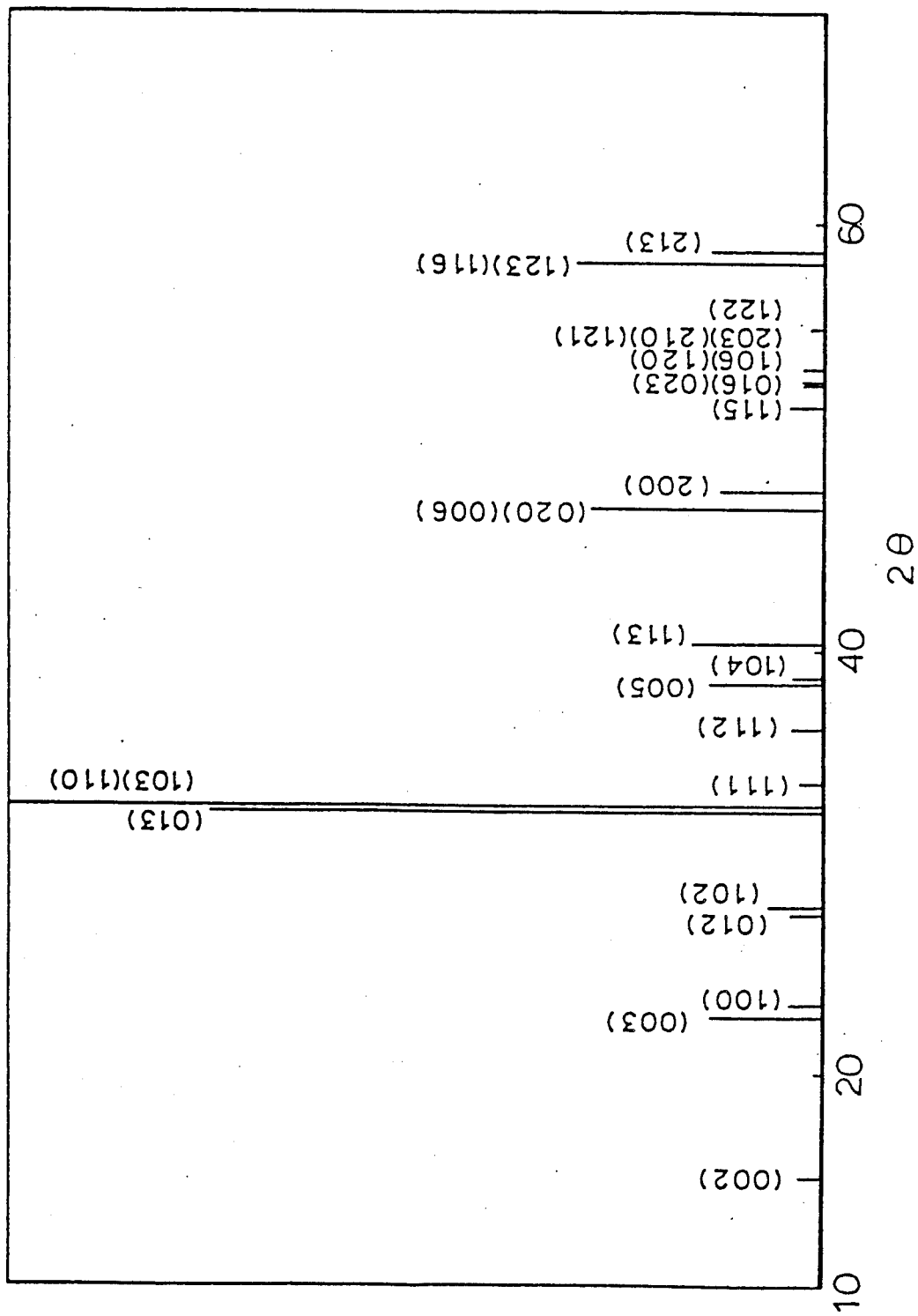
FIG. 2 is a powder X-ray diffraction chart observed in a powder represented by $Y_1Ba_2Cu_3O_7$ which is used in Example 1 as a standard.

FIG. 1 is a X-ray diffraction chart observed in the thin film prepared by the process of Example 1 measured in a X-ray diffraction analyzer (Rigaku Denki Co., Ltd) with $K\alpha$ of Cu. FIG. 2 is a powder X-ray diffraction chart observed in a powder sample represented by $Y_1Ba_2Cu_3O_7$ which is used as a reference.

In the powder X-ray diffraction chart of FIG. 2, the most intensive peak is observed at a crystal face corresponding to the indexes of (103) plane and (110) plane.

At first, terms of $I_{MAX}$, $I_{00n}$, $J_{MAX}$ and $J_{00n}$ are defined as following:

$I_{MAX}$: an intensity of the most intense peak of the (103) plane and (110) plane in the powder X-ray diffraction chart measured in the powder sample of $Y_1Ba_2Cu_3O_7$, $I_{00n}$: an intensity of the (00n) plane in the powder X-ray diffraction chart, wherein n is an integer, $J_{MAX}$: an intensity of a crystal face which has the same index of the crystal face of the (103) plane and (110) and which is observed in a X-ray diffraction chart measured in the thin film, $J_{00n}$: an intensity of the (00n) plane in the X-ray diffraction chart measured in the thin film.

$J_{111}$ and $J_{112}$: intensities of (111) plane and (112) plane in the X-ray diffraction chart measured in the thin film.

From the values of $I_{MAX}$, $I_{00n}$, $J_{MAX}$, $J_{00n}$, $J_{111}$ and $J_{112}$ of FIG. 1 and FIG. 2, there exist such relations or ratios of intensities among them as are shown in Table 1.

TABLE 1

| Crystal face | $\dfrac{I_{00n}}{I_{MAX}}$ | $\dfrac{J_{00n}}{J_{MAX}}$ | $\dfrac{J}{I}$ | $\dfrac{J_{00n}}{J_{111}}$ | $\dfrac{J_{00n}}{J_{112}}$ |
|---|---|---|---|---|---|
| (002) | 0.027 | 0.469 | 17.4 | 9.4 | 3.8 |
| (003) | 0.137 | 1.113 | 8.1 | 22.3 | 8.9 |
| (005) | 0.136 | 0.900 | 6.6 | 18.0 | 7.2 |
| (006) | 0.141 | 1.203 | 8.5 | 26.2 | 9.7 |

Note: $\dfrac{J}{I}$ is a ratio of $\dfrac{J}{I}$ $\dfrac{J_{00n}/J_{MAX}}{I_{00n}/I_{MAX}}$ From Table 1, it is apparent that the abovementioned relation of $J_{00n}/J_{MAX} \geq 2$ ($I_{00n}/I_{MAX}$) is satisfied in the thin film obtained.

The electron diffraction (ED) analysis revealed that the crystal structure of the thin film possessed c-axis which is perpendicular to a surface of the substrate.

The critical temperature Tc was determined by the common four probe method and the critical current density Jc was determined on a sample of the thin film having the thickness of 1,000 Å and a width of 1 mm in liquidized nitrogen. The result of Tc and Jc were
Tc: 85K
Jc: 150,000 $A/cm^2$ This result shows that the critical current density Jc can be improved remarkably by orientating c-axis to the direction which is perpendicular to a surface of the substrate.

EXAMPLE 2

Preparation of a thin film

Powders of $Y_2O_3$, BaO and CuO were mixed at a atom ratio of Y: Ba: Cu = 1:2.0:3.1 and then sintered in air at 900° C. for 3 hours. The sintered mass obtained was then pulverized to prepare a sintered powder.

The sintered and pulverized powder is used as a powder target in a high-frequency magnetron sputtering machine to deposit a thin film on a substrate consisting of a single crystal of $SrTiO_3$ under the following conditions:

Total gas pressure: $2 \times 10^{-2}$ Torr.
(Ratio of $O_2/Ar$): 0.15.
Index of a plane deposited: (100) plane of $SrTiO_3$.
Temperature of the substrate: 720° C.

The resulting thin film of a thickness of 1,000 Å was further heat-treated at 710° C. for 24 hours and then cooled down to ambient temperature slowly at a cooling rate of less than 3° C./min.

From the results of analysis described hereafter, it was concluded that the resulting thin film was composed of polycrystals consisting mainly of $Y_1Ba_2Cu_3O_{7-\delta}(0<\delta<1)$.

The results of Analysis

Table 2 shows similar relations or ratios of intensities as Table 1.

TABLE 2

| Crystal face | $\dfrac{I_{00n}}{I_{MAX}}$ | $\dfrac{J_{00n}}{J_{MAX}}$ | $\dfrac{J}{I}$ | $\dfrac{J_{00n}}{J_{111}}$ | $\dfrac{J_{00n}}{J_{112}}$ |
|---|---|---|---|---|---|
| (002) | 0.027 | 63.2 | 2340 | 3413 | 3012 |
| (003) | 0.137 | 142.1 | 1037 | 4521 | 3843 |
| (005) | 0.136 | 151.3 | 1112 | 3638 | 4567 |
| (006) | 0.141 | 172.6 | 1224 | 6453 | 5421 |

From Table 2, it is apparent that the relation of $$J_{00n}/J_{MAX} \geq 2(I_{00n}/I_{MAX})$$

is satisfied also in this thin film obtained.

The electron diffraction (ED) analysis revealed that the crystal structure of the thin film possessed c-axis which is perpendicular to a surface of the substrate.

The critical temperature Tc was determined by the common four probe method and the critical current density Jc was determined on a sample of the thin film having the thickness of 1,000 Å and a width of 1 mm in liquidized nitrogen. The result of Tc and Jc were
Tc: 86K
Jc: 160,000 A/cm²

What is claimed are:

1. A superconducting thin film comprising a compound oxide represented by the general formula $$Ln_1Ba_2Cu_3O_{7-\delta}$$

in which Ln is an element selected from a group consisting of Y, La, Gd, Ho, Er, Tm, Yb, Nd, Sm, Eu and Lu, and $\delta$ is a number between zero and one, wherein said thin film is deposited on a single crystal substrate and the X-ray diffraction chart of said thin film possesses at least one crystal face of (00n) plane having an intensity $J_{00n}$ in an X-ray diffraction pattern which satisfies the following relation:

$$J_{00n}/J_{MAX} \geq 2(I_{00n}/I_{MAX})$$

in which (00n) is an index of a crystal face of said thin film, wherein "n" is an integer;

$I_{MAX}$ is an intensity of the most intense peak in a powder X-ray diffraction chart measured in a powder sample of a compound oxide represented by a formula $Y_1Ba_2Cu_3O_7$ used as a reference;

$I_{00n}$ is an intensity of the (00n) plane in said powder X-ray diffraction chart;

$J_{MAX}$ is an intensity of a crystal face having the most intense peak in said powder X-ray diffraction chart and is observed in an X-ray diffraction chart measured in said thin film; and $J_{00n}$ is an intensity of the (00n) plane in said X-ray diffraction chart measured in said thin film.

2. A thin film as set forth in claim 1, wherein said thin film is a thin film prepared by physical vapor deposition technique on a substrate consisting of a single crystal.

3. A thin film as set forth in claim 1, wherein said (00n) planes of said thin film are (002) plane, (003) plane, (005) plane and (006) plane.

4. A thin film as set forth in claim 1, wherein said thin film is composed of a compound oxide containing Ba, Y and Cu and exhibits a X-ray diffraction pattern shown in FIG. 1.

5. A thin film as set forth in claim 1, wherein the thin film is a single crystal.

6. A thin film as set forth in claim 1, wherein the thin film is a single crystal.

7. A thin film as set forth in claim 2, wherein said substrate of single crystal has such lattice constant or lattice constants in a-axis and/or b-axis that are proximate to those of a crystal represented by a formula:

$$Ln_1Ba_2Cu_3O_7$$

in which, Ln stands for an element selected from a group comprising Y, La, Gd, Ho, Er, Tm, Yb, Nd, Sm, Eu and Lu.

8. A thin film as set forth in claim 2, wherein a surface of said substrate of single crystal on which said thin film is deposited is a crystal face of (100) plane.

9. A thin film as set forth in claim 2, wherein a surface of said single crystal substrate on which said thin film is deposited is a crystal face of (110) plane.

10. A thin film as set forth in claim 2, wherein said substrate of single crystal is a single crystal selected from a group comprising MgO, $SrTiO_3$, $Al_2O_3$, sapphire, $SiO_2$, quartz, YSZ and ZnO.

11. A thin film as set forth in claim 8, wherein each intensity of (002) plane, (003) plane, (005) plane and (006) plane observed in a X-ray diffraction chart measured in said thin film is more than double of intensities of (111) plane and (112) plane.

12. A thin film as set forth in claim 5, wherein the c-axis is oriented perpendicular to the plane defined by a-axis and b-axis of the crystal so that it has a high critical current density in a direction parallel to the surface of the substrate.

13. A thin film as set forth in claim 6, wherein the c-axis is oriented parallel to the plane defined by a-axis and b-axis of the crystal so that it has a high critical current density in a direction perpendicular to the surface of the substrate.

* * * * *